US012658870B2

(12) United States Patent 
Hertzberg et al.

(10) Patent No.: US 12,658,870 B2 
(45) Date of Patent: Jun. 16, 2026

(54) HOWL DETECTION IN AN AUDIO SYSTEM

(71) Applicant: NUANCE HEARING LTD., Tel Aviv (IL)

(72) Inventors: Yehonatan Hertzberg, Shoham (IL); Boaz Castro, Tel Aviv (IL); Gal Shemesh, Tel Aviv (IL)

(73) Assignee: Nuance Hearing Ltd., Tel-Aviv (IL)

( * ) Notice: Subject to any disclaimer, the term of this patent is extended or adjusted under 35 U.S.C. 154(b) by 181 days.

(21) Appl. No.: 18/741,861

(22) Filed: Jun. 13, 2024

(65) Prior Publication Data

US 2025/0337382 A1      Oct. 30, 2025

Related U.S. Application Data

(60) Provisional application No. 63/637,923, filed on Apr. 24, 2024.

(51) Int. Cl. 
*H03G 3/30* (2006.01) 
*H03G 3/32* (2006.01) 
(52) U.S. Cl. 
CPC ............. *H03G 3/3089* (2013.01); *H03G 3/32* (2013.01); *G10K 2210/506* (2013.01) 
(58) Field of Classification Search 
CPC .......... H03G 3/3089; H03G 3/32; H04B 3/23; H04B 3/237; H04B 7/015; H04L 2012/6491; G10K 2210/505; G10K 2210/506 
USPC ............ 381/66; 379/406.01, 406.12, 406.13; 370/286, 289 
See application file for complete search history.

(56) References Cited

U.S. PATENT DOCUMENTS

| | | | |
|---|---|---|---|
| 3,119,903 A | 1/1964 | Rosemond et al. |
| 4,904,078 A | 2/1990 | Gorike |
| 5,091,952 A | 2/1992 | Williamson et al. |
| 5,263,089 A | 11/1993 | Ribic |
| 5,608,803 A | 3/1997 | Magotra et al. |
| 5,793,875 A | 8/1998 | Lehr et al. |

(Continued)

FOREIGN PATENT DOCUMENTS

| | | |
|---|---|---|
| CA | 2297344 A1 | 8/2000 |
| CN | 205608327 U | 9/2016 |

(Continued)

OTHER PUBLICATIONS

Widrow et al., "Microphone Arrays for Hearing Aids: An Overview", Speech Communication, vol. 39, pp. 139-146, year 2003.

(Continued)

*Primary Examiner* — Xu Mei 
(74) *Attorney, Agent, or Firm* — Meitar Patents LTD.; Daniel Kligler

(57) ABSTRACT

An audio system includes one or more microphones, a speaker and processing circuitry. The one or more microphones are configured to output electrical signals in response to acoustic waves that are incident on the microphones. The processing circuitry is configured to amplify and filter the electrical signals, using a digital filter, so as to generate a drive signal for input to the speaker, to detect that a howl signal is building up by identifying in the drive signal multiple frequency components that are separated from one another by a constant frequency difference, and to adjust the drive signal to suppress the howl signal.

15 Claims, 6 Drawing Sheets

(56) References Cited

U.S. PATENT DOCUMENTS

| | | | |
|---|---|---|---|
| 6,289,327 | B1 | 9/2001 | Woodsum et al. |
| 6,434,539 | B1 | 8/2002 | Woodsum et al. |
| 7,031,483 | B2 | 4/2006 | Boone et al. |
| 7,092,690 | B2 | 8/2006 | Zancewicz |
| 7,099,486 | B2 | 8/2006 | Julstrom et al. |
| 7,103,192 | B2 | 9/2006 | Bailey |
| 7,369,669 | B2 | 5/2008 | Hagen et al. |
| 7,369,671 | B2 | 5/2008 | Sacha |
| 7,542,580 | B2 | 6/2009 | Burns |
| 7,609,842 | B2 | 10/2009 | Sipkema et al. |
| 7,697,696 | B2 * | 4/2010 | Okumura ............... H04R 3/02 |
| | | | 381/71.11 |
| 7,735,996 | B2 | 6/2010 | van der Zwan et al. |
| 7,809,149 | B2 | 10/2010 | Burns |
| 7,822,217 | B2 | 10/2010 | Hagen et al. |
| 8,116,493 | B2 | 2/2012 | Westermann |
| 8,139,801 | B2 | 3/2012 | Sipkema et al. |
| 8,306,241 | B2 * | 11/2012 | Kim ..................... H03G 9/005 |
| | | | 381/94.1 |
| 8,494,193 | B2 | 7/2013 | Zhang et al. |
| 8,611,554 | B2 | 12/2013 | Short et al. |
| 8,744,101 | B1 | 6/2014 | Burns |
| 9,113,245 | B2 | 8/2015 | Gelhard |
| 9,282,392 | B2 | 3/2016 | Ushakov |
| 9,288,589 | B2 | 3/2016 | Cheung |
| 9,392,381 | B1 | 7/2016 | Park et al. |
| 9,591,410 | B2 | 3/2017 | Short et al. |
| 9,635,474 | B2 | 4/2017 | Kuster |
| 9,641,942 | B2 | 5/2017 | Strelcyk et al. |
| 9,734,822 | B1 | 8/2017 | Sundaram et al. |
| 9,753,311 | B2 | 9/2017 | Fan |
| 9,763,016 | B2 | 9/2017 | Merks et al. |
| 9,781,523 | B2 | 10/2017 | Kuster et al. |
| 9,810,925 | B2 | 11/2017 | Fan |
| 9,812,116 | B2 | 11/2017 | Ushakov |
| 9,832,576 | B2 | 11/2017 | Jensen et al. |
| 9,980,054 | B2 | 5/2018 | McCracken |
| 10,056,091 | B2 | 8/2018 | Orescanin et al. |
| 10,102,850 | B1 | 10/2018 | Basye et al. |
| 10,225,670 | B2 | 3/2019 | Feilner et al. |
| 10,231,065 | B2 | 3/2019 | Udesen |
| 10,353,221 | B1 | 7/2019 | Graff et al. |
| 10,379,386 | B2 | 8/2019 | Fan |
| D865,040 | S | 10/2019 | Schaal et al. |
| D874,008 | S | 1/2020 | Kotzer et al. |
| 10,567,888 | B2 | 2/2020 | Hertzberg et al. |
| 10,582,295 | B1 | 3/2020 | Zhong et al. |
| 10,721,572 | B2 | 7/2020 | Petersen et al. |
| 10,805,739 | B2 | 10/2020 | Sjursen |
| 10,820,121 | B2 | 10/2020 | Lunner et al. |
| 11,259,127 | B2 | 2/2022 | De Haan et al. |
| 11,363,389 | B2 | 6/2022 | Pedersen et al. |
| 11,510,019 | B2 | 11/2022 | Rohde et al. |
| 11,521,633 | B2 | 12/2022 | Liu |
| 12,464,296 | B2 * | 11/2025 | Hertzberg ............ H04R 25/407 |
| 2004/0076301 | A1 | 4/2004 | Algazi et al. |
| 2004/0252845 | A1 | 12/2004 | Tasher |
| 2006/0013416 | A1 | 1/2006 | Truong et al. |
| 2007/0038442 | A1 | 2/2007 | Visser et al. |
| 2008/0107279 | A1 * | 5/2008 | Lai ..................... H04M 9/082 |
| | | | 381/66 |
| 2008/0192968 | A1 | 8/2008 | Ho et al. |
| 2009/0028367 | A1 | 1/2009 | Klinkby |
| 2009/0296044 | A1 | 12/2009 | Howell et al. |
| 2009/0323973 | A1 | 12/2009 | Dyba |
| 2011/0091057 | A1 | 4/2011 | Derkx et al. |
| 2011/0194715 | A1 * | 8/2011 | Pape ................... H04R 25/453 |
| | | | 381/318 |
| 2011/0293129 | A1 | 12/2011 | Dillen et al. |
| 2012/0128175 | A1 | 5/2012 | Visser et al. |
| 2012/0215519 | A1 | 8/2012 | Park et al. |
| 2012/0224715 | A1 | 9/2012 | Kikkeri |
| 2014/0093091 | A1 | 4/2014 | Dusan et al. |
| 2014/0093093 | A1 | 4/2014 | Dusan et al. |
| 2014/0270316 | A1 | 9/2014 | Kopina et al. |

| | | | |
|---|---|---|---|
| 2015/0036856 | A1 | 2/2015 | Pruthi et al. |
| 2015/0049892 | A1 | 2/2015 | Petersen et al. |
| 2015/0201271 | A1 | 7/2015 | Diethorn et al. |
| 2015/0230026 | A1 | 8/2015 | Eichfeld et al. |
| 2015/0289064 | A1 | 10/2015 | Jensen et al. |
| 2016/0037269 | A1 | 2/2016 | Puder et al. |
| 2016/0111113 | A1 | 4/2016 | Cho et al. |
| 2016/0165361 | A1 | 6/2016 | Miller et al. |
| 2017/0272867 | A1 | 9/2017 | Zisapel et al. |
| 2018/0146285 | A1 | 5/2018 | Benattar et al. |
| 2018/0270565 | A1 | 9/2018 | Ganeshkumar |
| 2018/0330747 | A1 | 11/2018 | Ebenezer |
| 2018/0350379 | A1 | 12/2018 | Wung et al. |
| 2018/0359294 | A1 | 12/2018 | Brown et al. |
| 2019/0014422 | A1 | 1/2019 | Lunner et al. |
| 2019/0028817 | A1 | 1/2019 | Gabai |
| 2019/0104370 | A1 | 4/2019 | Zisapel et al. |
| 2019/0149932 | A1 * | 5/2019 | Lesso ................. H04R 29/001 |
| | | | 381/56 |
| 2019/0373355 | A1 | 12/2019 | Lee et al. |
| 2019/0394576 | A1 | 12/2019 | Petersen et al. |
| 2019/0394586 | A1 | 12/2019 | Pedersen et al. |
| 2020/0005770 | A1 | 1/2020 | Lunner et al. |
| 2021/0345047 | A1 | 11/2021 | Sabin et al. |
| 2021/0409878 | A1 | 12/2021 | Pedersen et al. |
| 2022/0201403 | A1 | 6/2022 | Khaleghimeybodi et al. |
| 2022/0264231 | A1 | 8/2022 | Guo et al. |
| 2023/0186934 | A1 | 6/2023 | De Haan et al. |
| 2023/0336926 | A1 | 10/2023 | Hertzberg et al. |
| 2024/0096340 | A1 | 3/2024 | Malik et al. |

FOREIGN PATENT DOCUMENTS

| | | |
|---|---|---|
| CN | 106157965 A | 11/2016 |
| CN | 206115061 U | 4/2017 |
| CN | 206920741 U | 1/2018 |
| CN | 207037261 U | 2/2018 |
| CN | 208314369 U | 1/2019 |
| CN | 208351162 U | 1/2019 |
| CN | 209693024 U | 11/2019 |
| CN | 209803482 U | 12/2019 |
| CN | 112492434 A | 3/2021 |
| CN | 113940097 A | 1/2022 |
| CN | 114631331 A | 6/2022 |
| EP | 1439736 A1 | 7/2004 |
| EP | 4093055 A1 | 11/2022 |
| ES | 1213304 U | 5/2018 |
| JP | 2007028610 A | 2/2007 |
| JP | 2020061597 A | 4/2020 |
| KR | 20130054898 A | 5/2013 |
| KR | 101786613 B1 | 10/2017 |
| KR | 102006414 B1 | 8/2019 |
| WO | 9960822 A1 | 11/1999 |
| WO | 2004016037 A1 | 2/2004 |
| WO | 2013169618 A1 | 11/2013 |
| WO | 2017129239 A1 | 8/2017 |
| WO | 2017158507 A1 | 9/2017 |
| WO | 2017171137 A1 | 10/2017 |
| WO | 2018127298 A1 | 7/2018 |
| WO | 2018127412 A1 | 7/2018 |
| WO | 2018234628 A1 | 12/2018 |
| WO | 2021014344 A1 | 1/2021 |
| WO | 2021074818 A1 | 4/2021 |
| WO | 2022133086 A1 | 6/2022 |
| WO | 2025068818 A1 | 4/2025 |

OTHER PUBLICATIONS

Bose Hearphones™, "Hear Better", pp. 1-3, Feb. 19, 2017.
Veen et al., "Beamforming Techniques for Spatial Filtering", CRC Press, pp. 1-23, year 1999.
"ICE40 Series MobileFPGA Family," Product Information, Lattice Semiconductor, Santa Clara, Calif., pp. 1-2, last updated May 13, 2021, as downloaded from https://www.mouser.co.il/new/lattice-semiconductor/lattice-ice40-FPGA/.
Choi et al., "Blind Source Separation and Independent Component Analysis: A Review," Neural Information Processing—Letters and Review, vol. 6, No. 1, pp. 1-57, year 2005.

(56) References Cited

OTHER PUBLICATIONS

Mukai et al., "Real-Time Blind Source Separation and DOA Estimation Using Small 3-D Microphone Array," Proceedings of the International Workshop on Acoustic Echo and Noise Control (IWAENC), pp. 45-48, year 2005.

Huang et al., "Real-Time Passive Source Localization: A Practical Linear-Correction Least-Squares Approach," IEEE Transactions on Speech and Audio Processing, vol. 9, No. 8, pp. 943-956, year 2001.

Sawada et al., "Direction of Arrival Estimation for Multiple Source Signals Using Independent Component Analysis," IEEE Proceedings of the Seventh International Symposium on Signal Processing and its Applications, vol. 2, pp. 1-4, year 2003.

Adavanne et al., "Direction of Arrival Estimation for Multiple Sound Sources Using Convolutional Recurrent Neural Network," 26th European Signal Processing Conference (Eusipco), IEEE, pp. 1462-1466, year 2018.

Byrne et al., "An International Comparison of Long-Term Average Speech Spectra," The Journal of the Acoustical Society of America, vol. 96, No. 4, pp. 2108-2120, year 1994.

Wikipedia, "Direction of Arrival," pp. 1-2, last edited Nov. 15, 2020.

Dibiase, "A High-Accuracy, Low-Latency Technique for Talker Localization in Reverberant Environments Using Microphone Arrays," Doctoral Thesis, Division of Engineering, Brown University, Providence, Rhode Island, pp. 1-122, year 2000.

International Application # PCT/IB2024/058971 Search Report dated Jan. 20, 2025.

International Application # PCT/IB2024/058969 Search Report dated Jan. 23, 2025.

CN Application # 202080050547.6 Office Action dated Mar. 27, 2025.

Pauline et al., "Variable tap-length non-parametric variable step-size NLMS adaptive filtering algorithm for acoustic echo cancellation," Applied Acoustics, Elsevier, vol. 159, pp. 1-10, Feb. 2020.

Spriet et al., "Feedback control in hearing aids," Springer Handbook of Speech Processing and Speech Communication (Chapter 48, Part H.—Speech Enhancement; Benesty et al., eds.), Springer, pp. 1-29, year 2007.

Hoydal, "A New Own Voice Processing System for Optimizing Communication," The Hearing Review, pp. 1-8, Nov. 2017, as downloaded from https://hearingreview.com/practice-building/marketing/new-voice-processing-system-optimizing-communication.

Wikipedia, "Least Mean Squares Filter," pp. 1-6, last edited Jul. 23, 2019.

Camacho et al., "Phase Coherence Imaging: Principles, applications and current developments," POMA—Proceedings of Meetings on Acoustics, 2019 International Congress on Ultrasonics, Signal Processing in Acoustics: PSP (2/3) Presentation 1, pp. 1-7, year 2019.

Hertzberg, U.S. Appl. No. 18/476,369, filed Sep. 28, 2023.

Alkaher et al., "Temporal Howling Detector for Speech Reinforcement Systems," MDPI, Acoustics, vol. 4, pp. 967-995, year 2022.

Van Waterschoot, "Fifty Years of Acoustic Feedback Control: State of the Art and Future Challenges," Proceedings of the IEEE, vol. 99, No. 2, pp. 288-327, Feb. 2011.

Chen et al., "Novel Radiation Pattern by Genetic Algorithms in Wireless Communication," Proceedings of the IEEE VTS 53rd Vehicular Technology Conference, pp. 8-12, year 2001.

Mitchell, "An Introduction to Genetic Algorithms," MIT Press, pp. 1-162, year 1998.

Haupt, "An Introduction to Genetic Algorithms for Electromagnetics," IEEE Antennas and Propagation Magazine, vol. 37, No. 2, pp. 7-15, Apr. 1995.

Elbir et al., "Twenty-Five Years of Advances in Beamforming: From Convex and Nonconvex Optimization to Learning Techniques," IEEE Signal Processing Magazine, vol. 40, No. 4, pp. 118-131, Jun. 2023.

Hertzberg, U.S. Appl. No. 18/491,847, filed Oct. 23, 2023.

Chinese Office Action Application No. 202480004953.7, dated Sep. 13, 2025.

PCT International Search Report and Written Opinion # PCT/IL2025050272, dated Jul. 17, 2025.

Communication pursuant to Article 94(3) EPC, European application # 20 877 167.5, dated Jul. 1, 2025.

Israeli Notice of Deficiencies (P.K. 26), Patent Application # 322354, dated Dec. 3, 2025.

Israeli Notice of Deficiencies (P.K. 26), Patent Application 322355, dated Dec. 4, 2025.

Communication pursuant to Article 94(3) EPC, European Application # 20 844 216.0, dated Apr. 16, 2025.

JPO Decision to Grant (Notice of Allowance), Application # 2025-538610, dated Nov. 11, 2025.

* cited by examiner

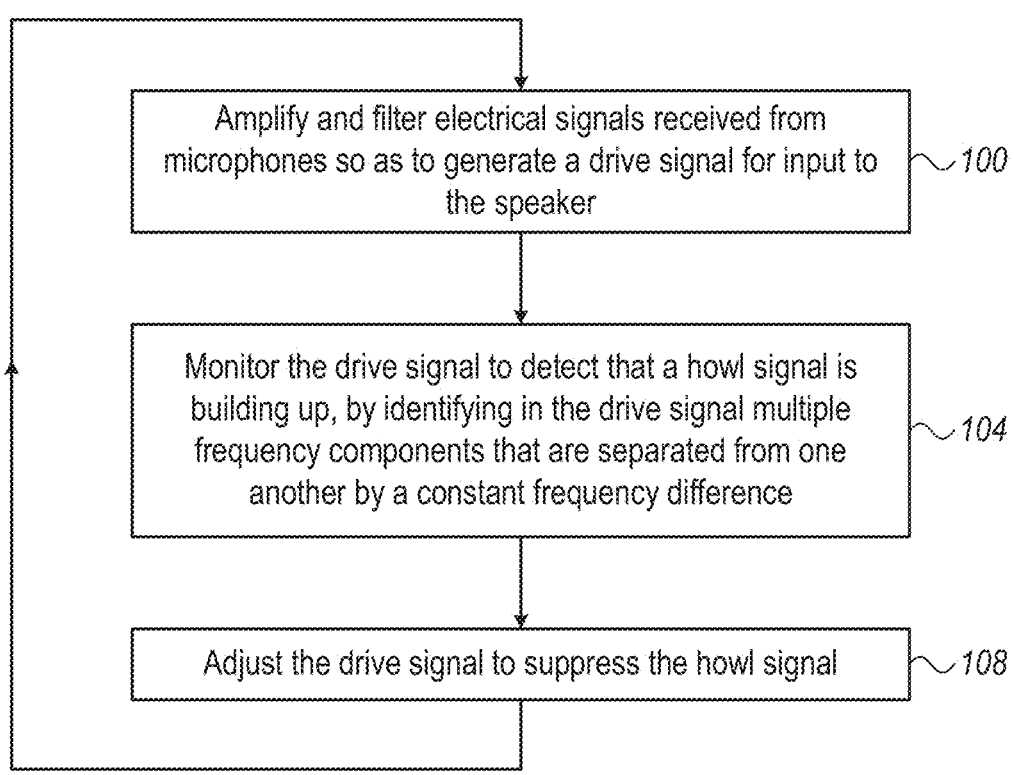

Amplify and filter electrical signals received from microphones so as to generate a drive signal for input to the speaker ~100

Monitor the drive signal to detect that a howl signal is building up, by identifying in the drive signal multiple frequency components that are separated from one another by a constant frequency difference ~104

Adjust the drive signal to suppress the howl signal ~108

*FIG. 4*

HOWL DETECTION IN AN AUDIO SYSTEM

CROSS-REFERENCE TO RELATED APPLICATIONS

This application claims the benefit of U.S. Provisional Patent Application 63/637,923, filed Apr. 24, 2024, whose disclosure is incorporated herein by reference.

TECHNICAL FIELD

Embodiments described herein relate generally to audio systems, and particularly to methods and systems for detection and suppression of howls in audio systems such as hearing assistance devices and sound reinforcement systems.

BACKGROUND

Some audio systems comprise one or more microphones and one or more speakers. In various situations acoustic feedback from the speakers to the microphones may result in degraded audio quality and even in undesirable howl sound.

Methods for handling acoustic feedback are known in the art. For example, in a survey paper entitled "Fifty Years of Acoustic Feedback Control: State of the Art and Future Challenges," proceeding of the IEEE, volume 99, number 2, February 2011, the authors aim to provide an overview of the state of the art in acoustic feedback control.

In a paper entitled "Temporal Howling Detector for Speech Reinforcement Systems," published in "Acoustics" volume 4, issue 4, pages 967-995, November 2022, the authors address the problem of howling detection in speech reinforcement system applications for utilization in howling control mechanisms.

SUMMARY

An embodiment that is described herein provides an audio system that includes one or more microphones, a speaker and processing circuitry. The one or more microphones are configured to output electrical signals in response to acoustic waves that are incident on the microphones. The processing circuitry is configured to amplify and filter the electrical signals, using a digital filter, so as to generate a drive signal for input to the speaker, to detect that a howl signal is building up by identifying in the drive signal multiple frequency components that are separated from one another by a constant frequency difference, and to adjust the drive signal to suppress the howl signal.

In some embodiments, the frequency difference is inversely proportional to a loop delay of the system. In other embodiments, the processing circuitry is configured to identify a dominant frequency component among the multiple frequency components, and to suppress the howl signal by reducing a gain of at least the dominant frequency component. In yet other embodiments, the processing circuitry is configured, after reducing the gain, to gradually increase the gain of the dominant frequency component while validating that the drive signal does not contain the multiple frequency components.

In an embodiment, the digital filter includes multiple sub-filters having respective frequency bands and gains, and the processing circuitry is configured to suppress the howl signal by reducing a gain of a sub-filter whose frequency band contains the at least dominant frequency component. In another embodiment, the processing circuitry is configured to identify that the drive signal contains the multiple frequency components by (i) calculating from the drive signal a normalized autocorrelation signal over a specified lag range, (ii) calculating a maximal value of the normalized autocorrelation signal within the lag range, and (iii) detecting that the maximal value exceeds a predefined threshold value. In yet another embodiment, the processing circuitry is configured to transform the normalized autocorrelation signal to a frequency domain, and to estimate a howl frequency of the howl signal by identifying a dominant frequency component in the frequency domain.

In some embodiments, the processing circuitry is configured to estimate the loop delay by finding a lag value in the lag range for which the normalized autocorrelation signal is maximized. In other embodiments, the digital filter includes a beamforming filter.

There is additionally provided, in accordance with an embodiment that is described herein, a method for audio processing, including mounting one or more microphones, which output electrical signals in response to acoustic waves that are incident on the microphones. A speaker is mounted. The electrical signals are amplified and filtered, using a digital filter, so as to generate a drive signal for input to the speaker. A howl signal that is building up is detected by identifying in the drive signal multiple frequency components that are separated from one another by a constant frequency difference. The drive signal is adjusted to suppress the howl signal.

There is additionally provided, in accordance with another embodiment that is described herein, a head-mountable device (HMD), including a frame, one or more microphones, a speaker, and processing circuitry. The frame is configured for mounting on a head of a subject. The one or more microphones are mounted on the frame and are configured to output electrical signals in response to acoustic waves that are incident on the microphones. The speaker is mounted on the frame. The processing circuitry is configured to amplify and filter the electrical signals, using a digital filter, so as to generate a drive signal for input to the speaker, to detect that a howl signal is building up by identifying in the drive signal multiple frequency components that are separated from one another by a constant frequency difference, and to adjust the drive signal to suppress the howl signal.

In some embodiments, the HMD includes a device selected from a list including: an eyewear device, a spectacle, a glasses frame, goggles, a helmet, visors, a headset, and a clip-on device. In other embodiments, the one or more microphones are mounted on a front piece of the frame, and the speaker is mounted on the frame in proximity to an ear of the subject.

These and other embodiments will be more fully understood from the following detailed description of the embodiments thereof, taken together with the drawings in which:

BRIEF DESCRIPTION OF THE DRAWINGS

FIG. 4 is a flow chart that schematically illustrates a method for howl detection and suppression, in accordance with an embodiment that is described herein;

DETAILED DESCRIPTION OF EMBODIMENTS

Overview

Figure 1:
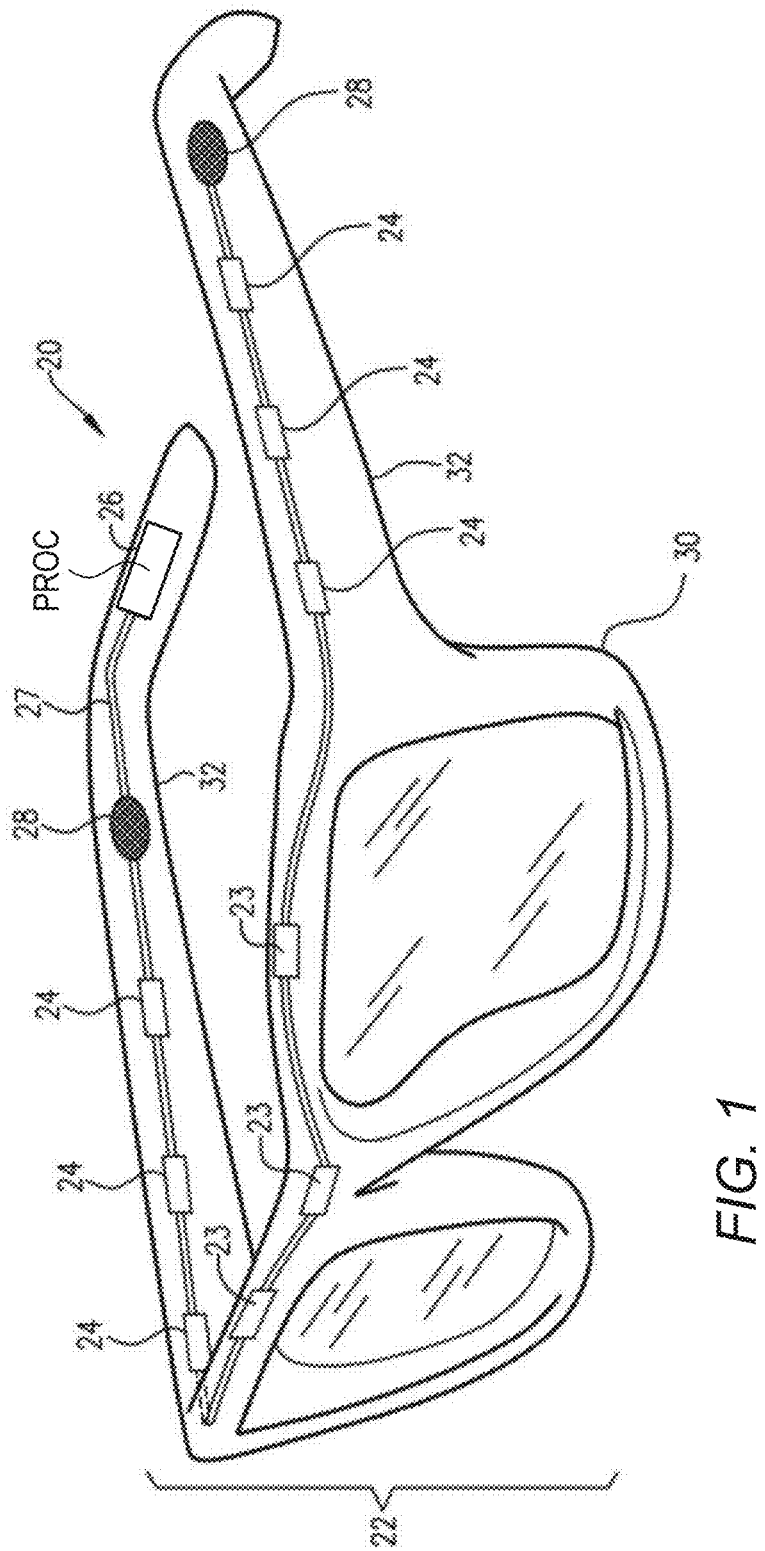
FIG. 1 is a schematic pictorial illustration of a hearing assistance device that is integrated into a spectacle frame, in accordance with an embodiment that is described herein.

Various audio systems such as hearing aid devices and sound reinforcement systems include one or more microphones and one or more speakers. The signals output by the microphones are typically processed to generate the audio output for the speakers. Such processing should reproduce natural hearing experience as nearly as possible while minimizing bothersome artifacts.

One of these artifacts is the strong howl that can arise due to acoustic feedback from the audio output of the speaker to the input of the microphones. Such howling arises when the acoustic feedback gain of the hearing aid at a given frequency is greater than a certain threshold (e.g., a gain greater than unity). Conventional solutions to this problem include reducing the gain, e.g., of the hearing aid and filtering the range of audio frequencies at which the feedback arises; but these solutions also reduce the effectiveness of the hearing aid or the sound reinforcement system in amplifying the desired signal. It is also possible to reduce the feedback gain mechanically by fitting an ear mold to the user's ear, but many users find this solution uncomfortable and unsightly.

In one conventional approach for feedback cancellation, candidate frequencies are detected using the magnitude slope deviation (MSD) method. In the MSD method it is assumed that in the frequency domain, the power of a howl component (e.g., a frequency bin) increases linearly over time when the power is given in a decibel scale. For the identification process, power values (in decibel) are stored sequentially in a finite length array. A reference gradient is calculated using the first and last values in the array. Gradient values for adjacent magnitude values are subsequently calculated and compared against this reference gradient to find deviations in gradient value. If the average deviation between gradients is smaller than a certain threshold, the frequency bin in question is flagged as a probable howl frequency.

For frequency candidates below, e.g., 4 KHz, a given candidate is likely to be a howl if the pitch fundamental frequency and its harmonics are absent. A notch filter is applied at the given candidate frequency to eliminate the howl sound.

The absence of harmonics mentioned above may be part of the peak-to-harmonic power ratio (PHPR) method, in which it is assumed that a howl signal has a pure tone nature, with no significantly higher harmonics. For the identification process, the power ratios between the suspected howl frequency and its harmonics and sub-harmonics are calculated and comprise a single ratio related value. If this ratio is larger than a certain threshold, the frequency bin in question is flagged as a probable howl frequency. Conventional feedback cancellation as described above may, however, fail to prevent the generation of a howl sound, e.g., due to excessive gain at the given candidate frequency, and/or when the acoustic transfer function between the speaker and microphones changes faster than the response time of the feedback cancellation method.

Feedback howling arises because the processing circuitry that is used to generate the audio output inherently defines, together with the one or more microphones and the speakers, an audio feedback loop; and this loop has a resonant frequency, for example due to the temporal latency of a digital filter in the processing circuitry.

Embodiments of the present invention address the source of this problem in a novel way, by identifying, in the drive signal generated for driving the speaker, multiple frequency components, that are indicative of an imminent howl signal starting to build up. The multiple frequency components are separated from one another by a constant frequency difference that depends on the loop delay of the system. Moreover, in an embodiment, a dominant frequency component among the multiple frequency components is indicative of the main howl frequency.

In some embodiments, the microphones and speaker are mounted on a frame that is mounted on the user's head. In some of the embodiments that are described below, the microphones s are mounted on a spectacle frame. Alternatively, the microphones and speaker can be mounted on other sorts of frames or head-mounted devices (HMDs), such as a Virtual Reality (VR) or Augmented Reality (AR) headset, or in other sorts of mounting arrangements. Further alternatively, the microphone(s) and speaker(s) may serve in a sound reinforcement system. In the present context, a sound reinforcement system refers to an audio system that comprises one or more microphones, one or more speakers and signal processing capabilities. The system picks audio sounds via the microphones, processes these sounds using signal processing methods and provides the processed signals to the speakers. Sound reinforcement systems may be used, for example, in a room or on stage for a large audience.

In the present context, an HMD comprises any sort of frame on which the microphones and speaker(s) can be mounted. The HMD may be selected from a list comprising (but not limited to): an eyewear device, a spectacle, a glasses frame, goggles, a helmet, visors, a headset, and a clip-on device. In some embodiments, the one or more microphones are mounted on a front piece of the frame, and the speaker is mounted on the frame in proximity to an ear of the subject.

Consider an audio system comprising one or more microphones, a speaker and processing circuitry. The microphones are configured to output electrical signals in response to acoustic waves that are incident on the microphones. The processing circuitry is configured to amplify and filter the electrical signals, using a digital filter (e.g., a beamforming filter to which howl mitigation methods have been incorporated), so as to generate a drive signal for input to the speaker, to detect that a howl signal is building up by identifying in the drive signal multiple frequency components that are separated from one another by a constant frequency difference (that in some embodiments is inversely proportional to a loop delay of the system), and to adjust the drive signal to suppress the howl signal.

In mitigating howling, the processing circuitry is configured to identify a dominant frequency component among the multiple frequency components, and to suppress the howl signal by reducing the gain of at least the dominant frequency component. In addition, the processing circuitry is configured, after reducing the gain, to gradually increase the gain of the dominant frequency component while validating that the drive signal does not contain the multiple frequency components.

In an embodiment, for controlling the gain for a frequency range containing the howl frequency, the digital filter comprises multiple sub-filters having respective frequency bands and gains, and the processing circuitry is configured to suppress the howl signal by reducing a gain of a sub-filter whose frequency band contains the at least dominant frequency component.

In an embodiment, to detect the howl signal using time-domain approach, the processing circuitry is configured to identify that the drive signal contains the multiple frequency components by (i) calculating from the drive signal a normalized autocorrelation signal over a specified lag range, (ii) calculating a maximal value of the normalized autocorrelation signal within the lag range, and (iii) detecting that the maximal value exceeds a predefined threshold value. The processing circuitry may transform the normalized autocorrelation signal to a frequency domain and estimate the howl frequency of the howl signal, by identifying a dominant frequency component in the frequency domain. Moreover, when applicable, the processing circuitry may estimate the loop delay by finding a lag value in the lag range for which the normalized autocorrelation signal is maximized.

In the disclosed techniques, a howl building up is detected by identifying in a drive signal of the speaker multiple frequency components that are separated by a constant frequency difference. A dominant frequency having the howl frequency is detected and component suppressed by reducing its gain. In some embodiments, the dominant frequency component may be detected efficiently by applying to the drive signal autocorrelation techniques over a short lag range. This allows fast detection of the howl signal before it becomes audible, therefore improving user experience significantly.

System Description

FIG. 1 is a schematic pictorial illustration of a hearing assistance device 20 that is integrated into a spectacle frame 22, in accordance with an embodiment that is described herein. An array of microphones 23, 24 are mounted at respective locations on spectacle frame 22 and output electrical signals in response to acoustic waves that are incident on the microphones. In the pictured example, microphones 23 are mounted on a front piece 30 of frame 22, while microphones 24 are mounted on temples 32, which are connected to respective edges of front piece 30. Although the extensive array of microphones 23 and 24 that is shown in FIG. 1 is useful in some applications of the present invention, the principles of signal processing and hearing assistance that are described herein may alternatively be applied, mutatis mutandis, using smaller numbers of microphones. For example, these principles may be applied using an array of microphones 23 on front piece 30, as well as in devices using other microphone mounting arrangements, not necessarily spectacle-based.

Processing circuitry 26 is fixed within or otherwise connected to spectacle frame 22 and is coupled by electrical wiring 27, such as traces on a flexible printed circuit, to receive the electrical signals output from microphones 23, 24. Although processing circuitry 26 is shown in FIG. 1, for the sake of simplicity, at a certain location in temple 32, some or all of the processing circuitry may alternatively be located in front piece 30 or in a unit connected externally to frame 22. Processing circuitry 26 mixes the signals from the microphones so as to generate an audio output with a certain directional response, for example by applying beamforming functions so as to emphasize the sounds that originate within a selected angular range while suppressing background sounds originating outside this range. Typically, although not necessarily, the directional response is aligned with the angular orientation of frame 22. The processing circuitry additionally suppresses acoustic signals originating from the speaker that are picked up by the microphones. In some embodiments, the beamforming functionality is omitted from the digital filter, e.g., when only one microphone is being used.

These signal processing functions of processing circuitry 26 are described in greater detail hereinbelow.

Processing circuitry 26 may convey the audio output to the user's ear via any suitable sort of interface and speaker. In the pictured embodiment, the audio output is created by a drive signal for driving one or more audio speakers 28, which are mounted on temples 32, typically in proximity to the user's ears. Although only a single speaker 28 is shown on each temple 32 in FIG. 1, device 20 may alternatively comprise only a single speaker on one of temples 32, or it may comprise two or more speakers mounted on one or both of temples 32. In this latter case, processing circuitry 26 may apply (using digital filter that supports beamforming) a beamforming function in the drive signals so as to direct the acoustic waves from the speakers toward the user's ears. Alternatively, the drive signals may be conveyed to speakers that are inserted into the ears or may be transmitted over a wireless connection, for example as a magnetic signal, to a telecoil in a hearing aid (not shown) of a user who is wearing the spectacle frame.

Signal Processing

Figure 2:
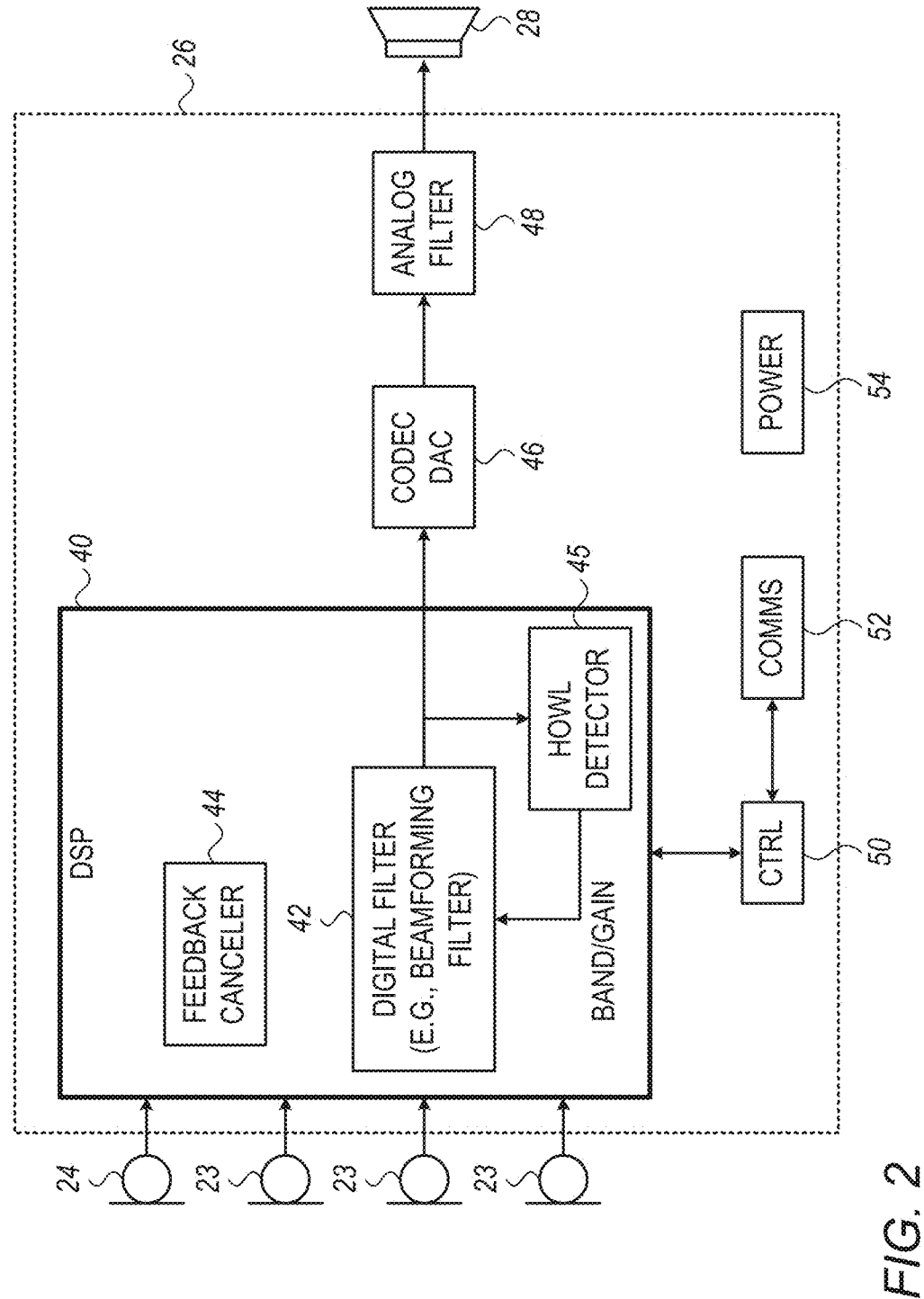
FIG. 2 is a block diagram that schematically shows details of processing circuitry in a hearing assistance embodiment that is device, in accordance with an described herein.

FIG. 2 is a block diagram that schematically shows details of processing circuitry 26 in hearing assistance device 20, in accordance with an embodiment that is described herein. Processing circuitry 26 can be implemented in a single integrated circuit chip or alternatively, the functions of processing circuitry 26 may be distributed among multiple chips, which may be located within or outside spectacle frame 22. Although one particular implementation is shown in FIG. 2, processing circuitry 26 may alternatively comprise any suitable combination of analog and digital hardware circuits, along with suitable interfaces for receiving the electrical signals output by microphones 23, 24 and outputting drive signals to speakers 28.

In the present embodiment, microphones 23, 24 comprise integral analog/digital converters, which output digital audio signals to processing circuitry 26. Alternatively, processing circuitry 26 may comprise an analog/digital converter for converting analog outputs of the microphones to digital form. Processing circuitry 26 typically comprises suitable programmable logic components 40, such as a digital signal processor (DSP) or a gate array, which implement the necessary filtering and mixing functions, as well as feedback cancellation functions and howl detection and suppression functions, to generate and output a drive signal for speaker 28 in digital form.

These filtering and mixing functions typically include application of a digital filter 42 (e.g., a beamforming filter) with coefficients chosen to create the desired directional responses. A variant of digital filter 42 that has beamforming functionality is also referred to herein as a "beamforming filter". Specifically, in some embodiments the coefficients of beamforming filter 42 are calculated to emphasize sounds that impinge on frame 22 (and hence on microphones 23, 24) within a selected angular range. Details of filters that may be used for the purpose of beamforming are described further hereinbelow. It is noted than when the audio system comprises a single microphone, the beamforming functionality may be omitted.

Alternatively or additionally, processing circuitry 26 may comprise a neural network (not shown), which is trained to determine and apply the coefficients to be used in beamforming filter 42. Further alternatively or additionally, processing circuitry 26 comprises a microprocessor, which is programmed in software or firmware to carry out at least some of the functions that are described herein. The software may be downloaded to the computer in electronic form, over a network, for example, or it may, alternatively or additionally, be provided and/or stored on non-transitory tangible media, such as magnetic, optical, or electronic memory.

Processing circuitry 26 may apply any suitable beamforming functions that are known in the art, in either the time domain or the frequency domain, in implementing beamforming filter 42. For example, a Minimum Variance Distortionless Response (MVDR) beamforming algorithm may be applied in order to achieve better spatial resolution. Other applicable beamforming techniques are based on Linear Constraint Minimum Variance (LCMV) and General Sidelobe Canceller (GSC) algorithms. Such beamforming algorithms, as well as other audio enhancement functions that can be applied by processing circuitry 26 are described, for example, in a PCT International Publication WO 2017/158507 (particularly pages 10-11) and in U.S. Pat. No. 10,567,888 (particularly in col. 9).

In some embodiments, processing circuitry 26 comprises a feedback canceller 44, which suppresses acoustic feedback from the speaker to the microphones. The goal of the feedback canceller is to prevent howl artifacts by reducing the amount of feedback signal within the signals produced by the microphones. The feedback canceler may be implemented using an adaptive filter as known in the art. In some situations, the acoustic transfer function between the speaker and microphone changes over time. With the time-varying transfer function the feedback canceler may fail to adapt fast enough, and a howl sound may be generated.

Processing circuitry comprises a howl detector 45, which detects and suppresses howl signals that build up in the system and were not suppressed by the feedback canceller. Howl detector 45 will be described in detail further below.

An audio output circuit 46, for example comprising a suitable codec and digital/analog converter (DAC), converts the digital drive signal output from beamforming filter 42 (or from feedback canceller 44 that follows the beamforming filter) to analog form. An analog filter 48 performs further filtering and analog amplification functions so as to optimize the analog drive signal to speaker 28.

A control circuit 50, such as an embedded microcontroller, controls the programmable functions and parameters of processing circuitry 26, possibly including feedback canceller 44. A communication interface 52, for example a Bluetooth® or other wireless interface, enables the user and/or an audiology professional to set and adjust these parameters as desired. A power circuit 54, such as a battery inserted into temple 32, provides electrical power to the other components of the processing circuitry.

Although FIG. 2 refers mainly to a hearing device, processing circuitry 26 (or suitable variants thereof) may also be used similarly in other audio systems such as in sound reinforcement systems. An example sound reinforcement system of this sort may comprise one or more microphones 23, digital filter 42, howl detector 45, DAC 46, analog filter 48 and speaker 28.

Suppression of Feedback Howl

As explained above, howling in the output from speaker 28 may be caused due to acoustic feedback from the speaker back to microphones 23 and 24. A howl caused due to acoustic feedback will build up only if the howl frequency has a wavelength that is an integer multiple of the length of the acoustic resonator that is created by filter 42 and the other elements of processing circuitry 26. The acoustic resonator length is equivalent in the time domain to the feedback latency (also referred to as a "loop delay" of hearing assistance device 20, which is equal to the internal latency of processing circuitry 26 ($T_{HA\_Latency}$) plus the acoustic propagation time from speaker 28 to one of microphones 23, 24 ($T_{AcousticPath}$) as given by:

$$T_{loop\_delay} = T_{HA\_Latency} + T_{AcousticPath}$$

A howl signal may build up at resonant frequencies $F_n$, which produce standing waves (changing their amplitudes) inside the acoustic resonator:

$$F_n = (T_{loop\_delay})^{-1} \cdot n, n = 1, 2, 3, \ldots$$

For example, assuming that hearing assistance device 20 has 8 ms internal latency and an acoustic path length of 0.13 ms between the speaker and microphone, the possible howl frequencies include:

$$F_n \approx 123 \ [\text{Hz}] \cdot n = 123, 246, 369, 492, \ldots \ [\text{Hz}]$$

The frequency components $F_n$ are separated from one another by a constant difference frequency $\Delta f$ given by:

$$\Delta f = F_n - F_{n-1} = 1 / T_{loop\_delay}$$

A frequency pattern of this sort may indicate that a howl signal is building up, due to the signal output by the speaker traversing the loop path an integer number of times, thus creating constructive interference. For example, if at a given frequency $F_n$ the loop gain is 1.1, the amplitude of the interfering howl will increase by 10% every round, and therefore may become audible after a few loop delay rounds. This leaves sufficient processing time for detecting and suppressing the howl signal before it becomes significantly audible.

Figure 3A:
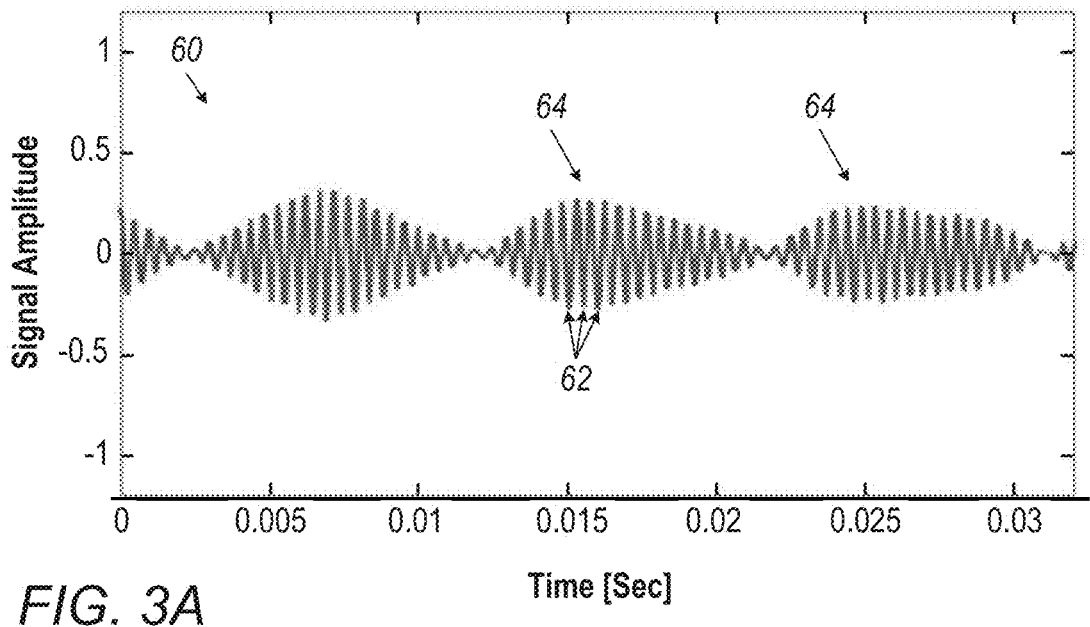
FIGS. 3A and 3B are diagrams that schematically illustrate an example howl signal driving the speaker, and a corresponding frequency density spectrogram, in accordance with embodiments that are described herein.
Figure 3B:
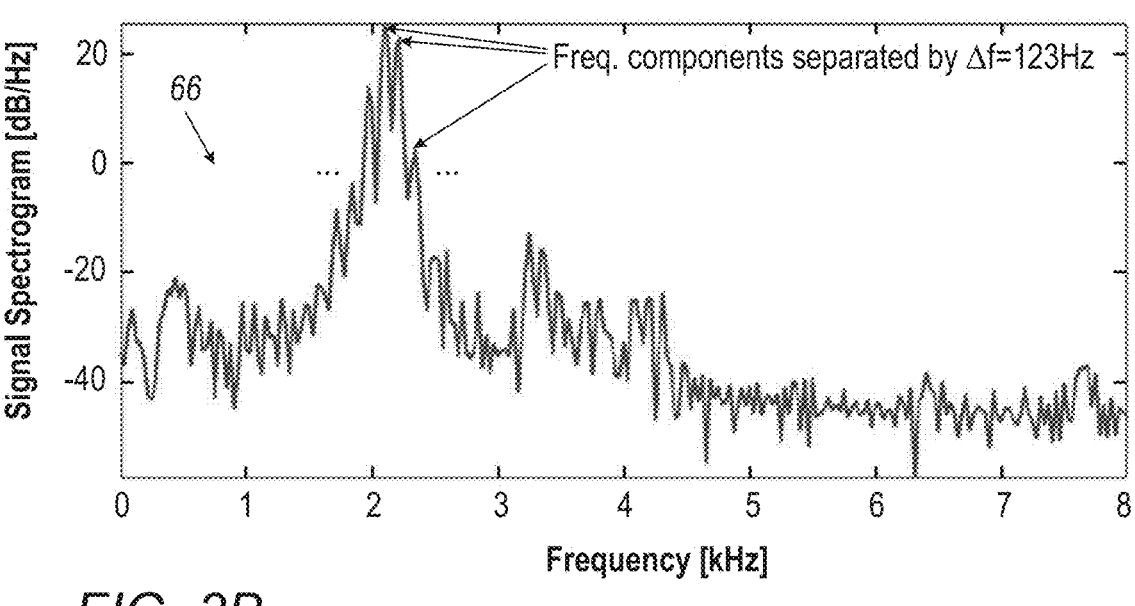

FIGS. 3A and 3B are diagrams that schematically illustrate an example howl signal 60 driving the speaker, and a corresponding frequency density spectrogram 66, in accordance with embodiments that are described herein. In the present example, the signals depicted in FIGS. 3A and 3B are generated within a hearing assistance device such as hearing assistance device 20.

In the present example, the howl signal has a sampling rate of 16 KHz, and the depicted time segment is about 30 ms long. The example pictured howl signal has a dominant howl component at a frequency of 2.1 KHz and the loop delay is 8.125 ms. As shown in FIG. 3A, in the time domain, the howl signal resembles an amplitude modulated signal, wherein the rapid inner signal (62) corresponds to the dominant howl frequencies (centered about 2.1 KHz) and the frequency of the envelope (64) corresponds to the inverse of the average loop delay, 123 Hz in this example.

As shown in FIG. 3B, in the frequency domain (66) the howl signal contains multiple frequency components separated by a constant frequency difference $\Delta f$ given by $\Delta f = 1/8.125\ ms = 123\ Hz$. In the present example, the dominant frequency component among the multiple frequency components has a frequency of 2.1 KHz.

Methods for Detection and Suppression of Howl Signals

FIG. 4 is a chart flow that schematically illustrates a method for howl detection and suppression, in accordance with an embodiment that is described herein. The method will be described as executed by processing circuitry 26 of hearing assistance device 20.

The method begins at a drive signal generation step 100, with circuitry processing 26 amplifying and filtering (e.g., using digital filter 42) electrical signals received from microphones 23, 24 so as to generate a drive signal for input to speaker 28 (e.g., via output audio circuit 46 and analog filter 48).

At a signal monitoring step 104, processing circuitry 26 monitors the drive signal of step 100 to detect that a howl signal is building up, by identifying in the drive signal multiple frequency components that are separated from one another by a constant frequency difference. Identifying that the drive signal contains the multiple frequency components may be carried out in the frequency domain or in the time domain.

At a suppression step 108, responsively to detecting the howl signal at step 104, the processing circuitry adjusts the drive signal to suppress the howl signal. For example, if at step 104 the processing circuitry identifies dominant frequency component among the multiple frequency components, the processing circuitry suppresses the howl signal by reducing the gain of at least the dominant frequency component.

For example, the processing circuitry may suppress the howl signal by reducing the gain of digital filter 42 within a predefined frequency range centered about the dominant frequency component in the drive signal. Since the width of a howl tone (with respect to half power points relative to the peak of the howl tone) is typically on the order of tens of Hz, a suitable frequency range of several tens of Hz that covers the width of the howl tone can be used.

In some embodiments, at step 108, and after reducing the gain, the processing circuitry gradually increases the gain of the dominant frequency component (and possibly other frequency components if applicable) while validating that the drive signal does not contain the multiple frequency components (e.g., by looping back to step 100 followed by step 104. This mechanism allows to recover back to a default gain when the conditions causing the howl are no longer valid.

Controlling the gain of the at least dominant frequency can be carried out, for example, by modifying the coefficients of the digital filter, to modify the transfer function of the filter, accordingly. In alternative embodiments, the digital filter comprises multiple sub-filters having respective frequency bands and gains. In these embodiments, the processing circuitry suppresses the howl signal by reducing the gain of a sub-filter whose frequency band contains the at least dominant frequency component.

Following step 108, processing circuitry 26 loops back to step 100 to apply beamforming to subsequent electrical signals received from the microphones.

Figure 5:
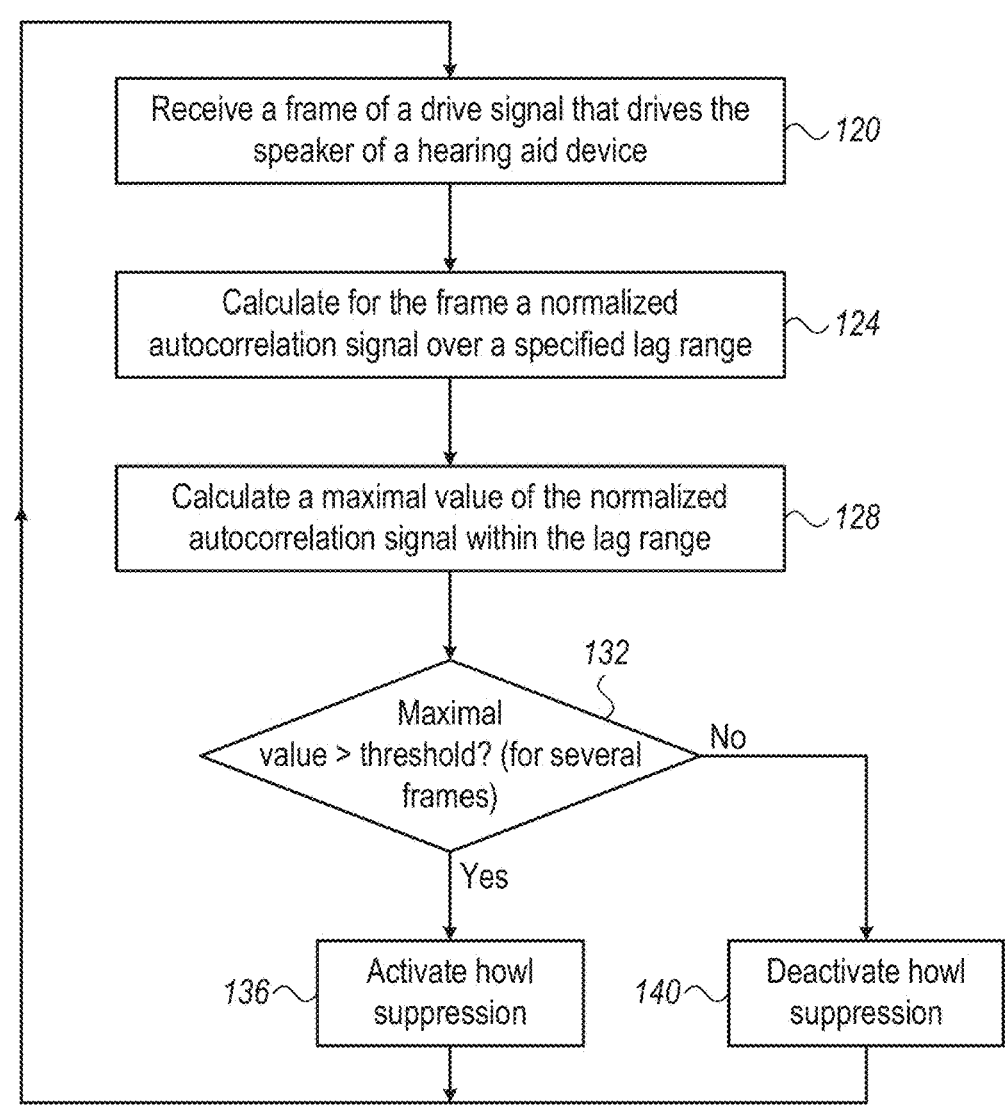
FIG. 5 is that schematically a flow chart illustrates a method for detection and suppression of a howl signal based on calculating autocorrelation in the time domain, in accordance with an embodiment that is described herein.

FIG. 5 is a flow chart that schematically illustrates a method for detection and suppression of a howl signal based on calculating autocorrelation in the time domain, in accordance with an embodiment that is described herein.

The method may be executed by elements of processing circuitry 26 of hearing assistance device 20 and in particular by howl detector 45. The method begins at a frame reception step 120 with howl detector 45 receiving a frame of a drive signal that drives the speaker (28) of a hearing aid device 20. The frame may contain any suitable number 'N' of digital samples. In the present example, the frame contains N=16 samples of the drive signal, which is sampled at a sampling rate of 16 KZ.

At an autocorrelation calculation step 124, the howl detector calculates for the frame a normalized autocorrelation signal $\Gamma$ over a specified lag range as given by:

$$\Gamma(m) = \frac{\sum_{n=1}^{N} s(n)s(n-m)}{\sqrt{\sum_{n=1}^{N} [s(n)]^2 \sum_{n=1}^{N} [s(n-m)]^2}},\ m \in \text{Lag Range}$$

wherein s(n) denotes the drive signal in the time domain ('n' being a time index), and $\Gamma(m)$ denotes the normalized autocorrelation value at lag 'm' in a lag range denoted Lag Range. In the present example the normalized autocorrelation signal $\Gamma(m)$ gest values in the range $[-1, 1]$ and is expected to get a maximal value at a lag value corresponding to (or closest to) the loop delay. Since in the present example, the loop delay is known to be about 8 ms, the lag value corresponding to this loop delay is 8 ms·16 KHz=128. To find the actual loop delay it may be sufficient to search for the maximal $\Gamma(m)$ value in a short lag range, e.g., 16 lag values in a lag range given by $119 \le m \le 134$. The lag range may be determined based on the loop delay when this loop delay is known in advance. Alternatively, any other suitable lag range can also be used.

At a maximal value calculation step 128, the howl detector calculates the maximal value of the normalized autocorrelation within the lag range. This maximal value is also referred to as a harmonic ratio (HR) as given by:

$$HR = \max_{Lag\ Range} \{\Gamma(m)\}$$

At a detection step 132, the howl detector compares between the HR value calculated at step 128 and a predefined threshold denoted HR_thresh. When HR>HR_thresh, the howl detector detects a howl signal, and activates howl suppression at an activation step 136. Otherwise, the howl detector deactivates howl suppression at a deactivation step 140. Following each of steps 136 and 140 the howl detector loops back to step 120 to receive a subsequent frame of the drive signal. A method for activating/deactivating suppression is described below with reference to FIG. 6.

In some embodiments, the howl detector performs the query at step 132 over multiple frames, to achieve smoother operation in transition between activation and deactivation. For example, the howl detector checks the condition HR>HR_thresh (mentioned above) over a group of multiple recent frames, and activates (or deactivates) suppression if the condition is met in a predefined number of frames in the group.

Figure 6:
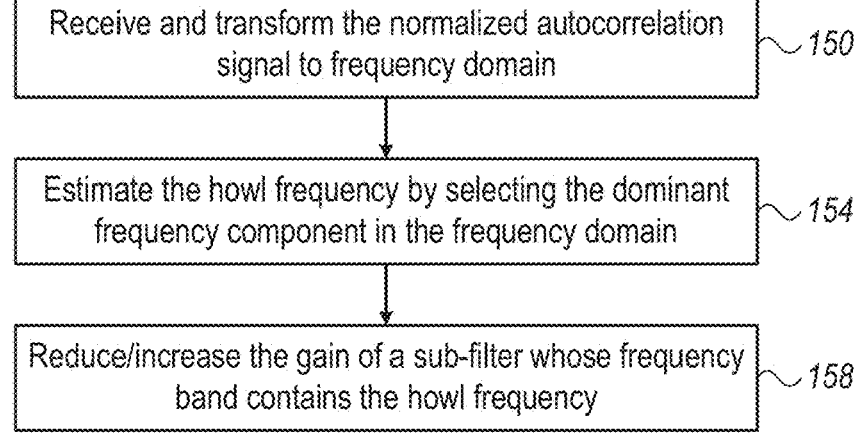
FIG. 6 is a flow chart that schematically illustrates a method for activation/deactivation of howl suppression, in accordance with an embodiment that is described herein.

FIG. 6 is a flow chart that schematically illustrates a method for activation/deactivation of howl suppression, in accordance with an embodiment that is described herein.

The method may be used, for example, in implementing steps 136 and 140 of the method of FIG. 5.

In describing the method of FIG. 6, it is assumed that digital filter 42 comprises multiple sub-filters (not shown) having respective frequency bands and gains, wherein the gains are controllable by the howl detector.

The method begins with howl detector 45 receiving a normalized autocorrelation signal (calculated at step 124 of the method of FIG. 5) and transforming the autocorrelation signal to the frequency domain. The transformation from time domain to frequency domain may be carried out, for example, by applying to the time domain autocorrelation signal a discrete Fourier transform (DFT), e.g., using a fast Fourier transform (FFT) method. Alternatively, other suitable methods for extracting frequency information from a time-domain signal can also be used.

At a howl frequency estimation step 154, the howl detector estimates the howl frequency by selecting the dominant frequency component in the frequency domain.

At an activate/deactivate suppression step 158, the howl detector reduces (for suppression activation) or increases (for suppression deactivation) the gain of a sub-filter whose frequency band contains the estimated howl frequency. In an embodiment, the howl detector applies suppression deactivation operation only after suppression activation. Following step 158 the method terminates.

In some embodiments, after activating suppression, the howl detector reduces the gain of the relevant sub-filter sharply to prevent the howl signal from building up. In some embodiments, after deactivating suppression, the howl detector gradually increases the gain of the relevant sub-filter, e.g., over multiple cycles of the method of FIG. 5. In an example embodiment, for this purpose, the howl detector may hold a predefined sequence of gain values that increase along the sequence. In an alternative embodiment, the howl detector may select increasing gain values for the cycles, on the fly.

In some embodiments, howls for speech signals with relatively low pitch frequency may result in false detection, e.g., using the howl detection methods described above. In such cases, the howl detector may apply a high pass filter to the drive signal to suppress low-frequency speech energy and retain the relatively high howl energy at high frequencies. In another embodiment, false detection may be avoided by calculating correlation between frames, because unlike the pitch that typically varies with time, the frequencies of the howl signal are more fixed in time.

Consider an example sequence of operations for mitigating howls, using the embodiments described above: (1) a subject using the hearing device puts his hand between the speaker and microphone, which modifies the speaker to microphone acoustic transfer function. (2) As a result, a howl signal starts to build up at a certain howl frequency. (3) The howl detector detects the howl before it becomes audible, thus retaining good user experience. (4) The howl detector activates howl suppression to reduce the amplification gain at least at the howl frequency. (5) The howl detector gradually reduces the amplification gain at the howl frequency to its normal level while no howls are detected.

Example Signals Related to Howl Detection

Figure 7:
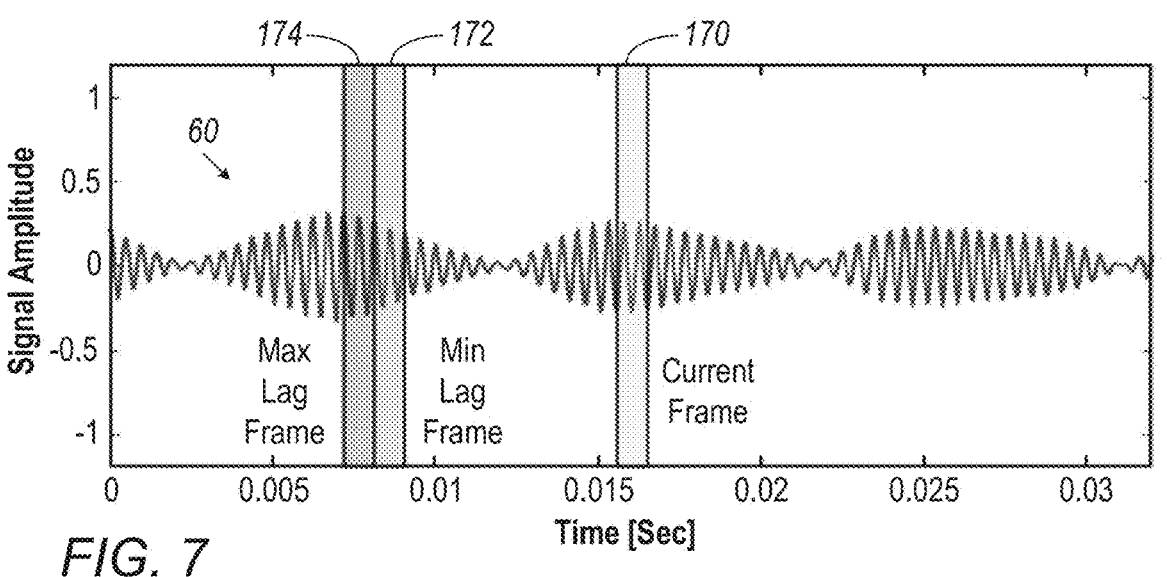
FIG. 7 is a diagram that schematically illustrates the howl signal of FIG. 3A and time frames used for calculating a normalized autocorrelation signal, in accordance with an embodiment that is described herein.

FIG. 7 is a diagram that schematically illustrates the howl signal of FIG. 3A and time frames used for calculating a normalized autocorrelation signal, in accordance with an embodiment that is described herein.

The figure depicts a frame 170 of length N=16 samples, for which the howl detector calculates the normalized autocorrelation (e.g., as described at step 124 the method of FIG. 5). In the present example, a 16-sample frame 172 is used for calculating the autocorrelation for a minimal lag of 119 samples, and a 16-sample frame 174 is used for calculating the autocorrelation for a maximal lag of 134 samples. Other frames for lag values in the range 119-134 are omitted for the sake of clarity.

Figure 8:
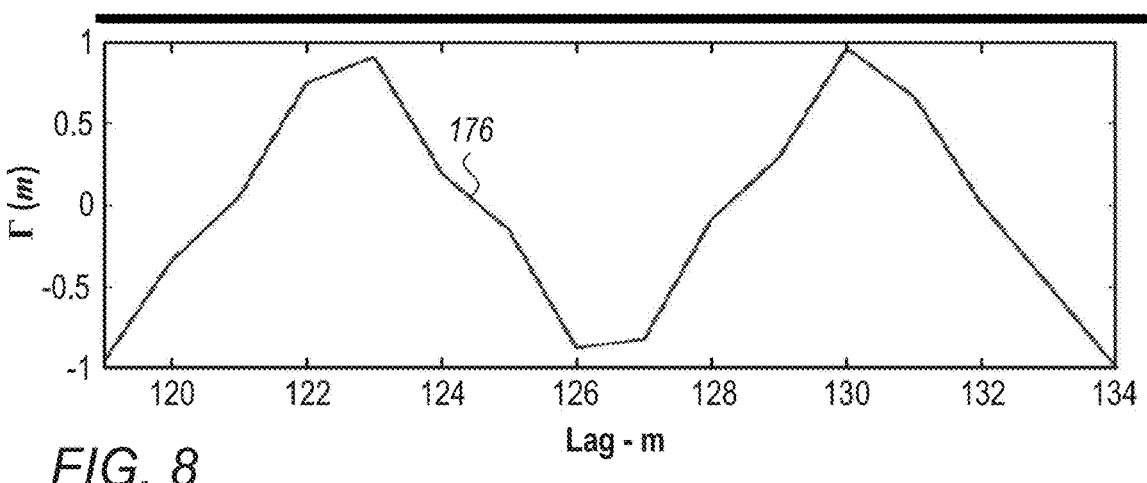
FIG. 8 is a diagram that schematically illustrates a normalized autocorrelation signal of the howl signal of FIG. 7, in accordance with an embodiment that is described herein.

FIG. 8 is a diagram that schematically illustrates a normalized autocorrelation signal $\Gamma(m)$ 176 of the howl signal of FIG. 7, in accordance with an embodiment that is described herein. In this example, the normalized autocorrelation signal is given for lag values in the range m=119 . . . 134. As shown in the figure, the normalized autocorrelation signal $\Gamma(m)$ is periodic with a period of about 8 samples (due to the howl frequency of 2.1 KHz). The $\Gamma(m)$ signal has a maximal value close to unity at a lag of m=130, meaning that the estimated loop delay is given by 130/16 KHz=8.125 ms.

Figure 9:
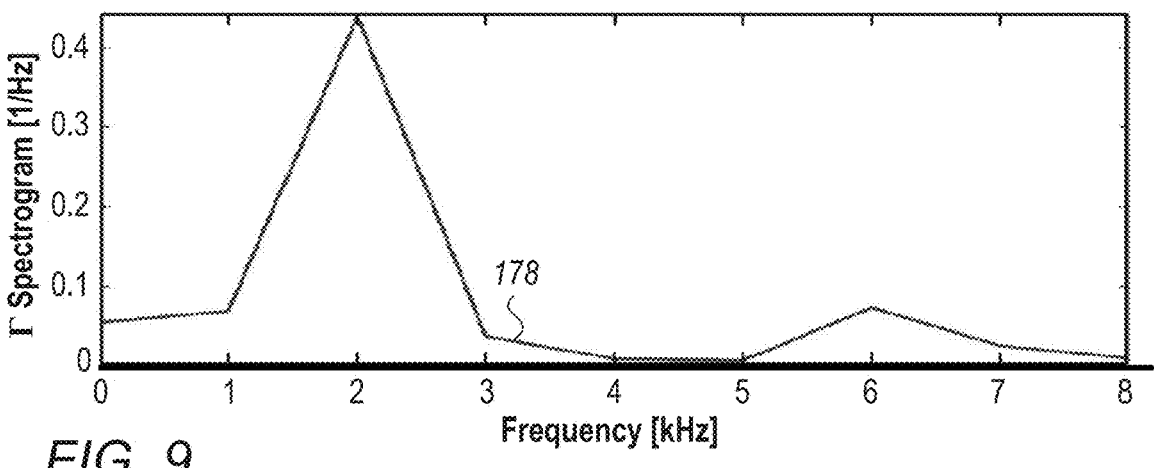
FIG. 9 is a diagram that schematically illustrates the normalized autocorrelation signal of FIG. 8 transformed to the frequency domain, in accordance with an embodiment that is described herein.

FIG. 9 is a diagram that schematically illustrates the normalized autocorrelation signal of FIG. 8 transformed to the frequency domain, in accordance with an embodiment that is described herein.

The frequency domain signal 178 is depicted for a frequency range 0-8 KHz. As shown in the figure, the frequency domain 178 signal corresponding to the normalized autocorrelation signal 176 has a dominant frequency component at 2 KHz. Consequently, in some embodiments, the howl detector can estimate the howl frequency by finding the dominant frequency component in the frequency domain.

The embodiments described above are given by way of example, and other suitable embodiments can also be used.

For example, in the above-described embodiments, howl detection is based on calculating a time-domain autocorrelation signal. In alternative embodiments, however, detecting the howl signal may be carried out by identifying the frequency components that are separated by a constant frequency difference in the frequency domain, using any suitable spectral analysis methods.

As another example, the howl detection and suppression functionality in the embodiments above may be implemented in conjunction with or independently of the beamforming techniques described above.

Although the embodiments described herein (e.g., the methods of FIGS. 4, 5 and 6) mainly address preventing howls in hearing aid devices, the methods and systems described herein can also be used in other applications, such as in any sound reinforcement system that possibly employs large loudspeakers.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An audio system, comprising:
   one or more microphones, which are configured to output electrical signals in response to acoustic waves that are incident on the microphones;
   a speaker; and
   processing circuitry, which is configured to amplify and filter the electrical signals, using a digital filter, so as to generate a drive signal for input to the speaker, to detect that a howl signal is building up by identifying in the drive signal multiple frequency components that are separated from one another by a constant frequency difference, and to adjust the drive signal to suppress the howl signal.

2. The audio system according to claim 1, wherein the frequency difference is inversely proportional to a loop delay of the system.

3. The audio system according to claim 1, wherein the processing circuitry is configured to identify a dominant frequency component among the multiple frequency components, and to suppress the howl signal by reducing a gain of at least the dominant frequency component.

4. The audio system according to claim 3, wherein the processing circuitry is configured, after reducing the gain, to gradually increase the gain of the dominant frequency component while validating that the drive signal does not contain the multiple frequency components.

5. The audio system according to claim 3, wherein the digital filter comprises multiple sub-filters having respective frequency bands and gains, and wherein the processing circuitry is configured to suppress the howl signal by reducing a gain of a sub-filter whose frequency band contains the at least dominant frequency component.

6. The audio system according to claim 1, wherein the processing circuitry is configured to identify that the drive signal contains the multiple frequency components by (i) calculating from the drive signal a normalized autocorrelation signal over a specified lag range, (ii) calculating a maximal value of the normalized autocorrelation signal within the lag range, and (iii) detecting that the maximal value exceeds a predefined threshold value.

7. The audio system according to claim 1, wherein the digital filter comprises a beamforming filter.

8. A method for audio processing, comprising:
   mounting one or more microphones, which output electrical signals in response to acoustic waves that are incident on the microphones;
   mounting a speaker;
   amplifying and filtering the electrical signals, using a digital filter, so as to generate a drive signal for input to the speaker;
   detecting that a howl signal is building up by identifying in the drive signal multiple frequency components that are separated from one another by a constant frequency difference; and
   adjusting the drive signal to suppress the howl signal.

9. The method according to claim 8, wherein the frequency difference is inversely proportional to a loop delay of the system.

10. The method according to claim 8, and comprising, identifying a dominant frequency component among the multiple frequency components, and suppressing the howl signal by reducing a gain of at least the dominant frequency component.

11. The method according to claim 10, and comprising, after reducing the gain, gradually increasing the gain of the dominant frequency component while validating that the drive signal does not contain the multiple frequency components.

12. The method according to claim 10, wherein the digital filter comprises multiple sub-filters having respective frequency bands and gains, and wherein suppressing the howl signal comprises reducing a gain of a sub-filter whose frequency band contains the at least dominant frequency component.

13. The method according to claim 8, wherein identifying in the drive signal the multiple frequency components comprises (i) calculating from the drive signal a normalized autocorrelation signal over a specified lag range, (ii) calculating a maximal value of the normalized autocorrelation signal within the lag range, and (iii) detecting that the maximal value exceeds a predefined threshold value.

14. A head-mountable device (HMD), comprising:
   a frame, which is configured for mounting on a head of a subject;
   one or more microphones mounted on the frame and configured to output electrical signals in response to acoustic waves that are incident on the microphones;
   a speaker mounted on the frame; and
   processing circuitry, which is configured to amplify and filter the electrical signals, using a digital filter, so as to generate a drive signal for input to the speaker, to detect that a howl signal is building up by identifying in the drive signal multiple frequency components that are separated from one another by a constant frequency difference, and to adjust the drive signal to suppress the howl signal.

15. The HMD according to claim 14, wherein the HMD comprises a device selected from a list comprising: an eyewear device, a spectacle, a glasses frame, goggles, a helmet, visors, a headset, and a clip-on device.

* * * * *